(12) United States Patent
Hsiao

(10) Patent No.: US 9,431,073 B2
(45) Date of Patent: ***Aug. 30, 2016

(54) LOW POWER MEMORY DEVICE

(71) Applicant: Chih-Cheng Hsiao, Taichung (TW)

(72) Inventor: Chih-Cheng Hsiao, Taichung (TW)

(73) Assignee: Chih-Cheng Hsiao, Taichung (TW)

( * ) Notice: Subject to any disclaimer, the term of this patent is extended or adjusted under 35 U.S.C. 154(b) by 104 days.

This patent is subject to a terminal disclaimer.

(21) Appl. No.: 14/318,506

(22) Filed: Jun. 27, 2014

(65) Prior Publication Data

US 2015/0279435 A1  Oct. 1, 2015

(30) Foreign Application Priority Data

Mar. 28, 2014  (TW) .............................. 103111756 A

(51) Int. Cl.
| | | |
|---|---|---|
| *G11C 29/00* | (2006.01) | |
| *G11C 7/10* | (2006.01) | |
| *G11C 7/12* | (2006.01) | |
| G11C 7/06 | (2006.01) | |
| G11C 7/18 | (2006.01) | |

(52) U.S. Cl.
CPC ............... *G11C 7/10* (2013.01); *G11C 7/1057* (2013.01); *G11C 7/1069* (2013.01); *G11C 7/12* (2013.01); *G11C 7/06* (2013.01); *G11C 7/18* (2013.01)

(58) Field of Classification Search
CPC ..... G11C 7/1057; G11C 7/1069; G11C 7/12; G11C 7/06; G11C 7/18
See application file for complete search history.

(56) References Cited

U.S. PATENT DOCUMENTS

| | | | | |
|---|---|---|---|---|
| 7,196,942 B2* | 3/2007 | Khurana | .............. | G11C 7/1051 |
| | | | | 326/38 |
| 7,626,850 B2* | 12/2009 | Branch | .................. | G11C 11/412 |
| | | | | 365/154 |
| 2004/0257860 A1* | 12/2004 | Fenstermaker | ....... | G11C 11/419 |
| | | | | 365/156 |
| 2013/0088926 A1* | 4/2013 | Tao | ........................ | G11C 11/419 |
| | | | | 365/189.05 |

FOREIGN PATENT DOCUMENTS

TW            201411637 A       3/2014

* cited by examiner

*Primary Examiner* — Esaw Abraham
(74) *Attorney, Agent, or Firm* — Winston Hsu; Scott Margo

(57) ABSTRACT

A memory device includes a memory cell unit, a bit line unit and a buffering unit. The memory cell unit includes a plurality of memory cell groups. Each memory cell group includes at least one memory cell for storing data therein. The bit line unit includes a plurality of first bit lines each coupled to the at least one memory cell of a respective memory cell group, and a second bit line for transmitting to-be-read data. The buffering unit includes a plurality of two-state buffers. Each two-state buffer has an input terminal coupled to a respective first bit line, and an output terminal coupled to the second bit line. The memory device does not require a sense amplifier, and thus consumes relatively small power. The memory device can operate at a relatively high frequency when properly configured.

14 Claims, 15 Drawing Sheets

LOW POWER MEMORY DEVICE

CROSS-REFERENCE TO RELATED APPLICATIONS

This application claims the priority of Taiwanese Application No. 103111756, filed on 28 Mar. 2014, the disclosure of which is hereby incorporated by reference.

TECHNICAL FIELD

This invention relates to a memory device, and more particularly to a low power memory device.

BACKGROUND

Referring to FIG. 1, a conventional memory device includes a memory cell array 10, a plurality of parallel bit lines 11 coupled to the memory cell array 10, and a plurality of parallel word lines 12 coupled to the memory cell array 10.

The memory cell array 10 includes a plurality of memory cells 13. The word lines 12 intersect the bit lines 11, and are electrically isolated from the bit lines 11. The word lines 12 transmit a control input to the memory cells 13 in order to control the memory cells 13 to output data stored therein to the bit lines 11.

As the demand for storage capacity of memory devices increases, memory cell arrays 10 with many more memory cells 13 would be preferable. However, to accommodate this, each bit line 11 is made longer to be coupled to more memory cells 13, which inevitably increases a capacitance seen thereat.

Because of the relatively large capacitance seen at each bit line 11, voltages outputted by the memory cells 13 may not promptly propagate to the bit lines 11 (i.e., the memory cells 13 may not be able to drive the bit lines 11 efficiently). As a result, a plurality of sense amplifiers 14 are employed to be coupled respectively to the bit lines 11 to assist in amplifying voltages on the bit lines 11 in order to facilitate data transmission and allow the memory device to operate at a higher frequency.

Nonetheless, the sense amplifiers 14 may be undesirable components of the memory device due to their relatively large power consumption. Therefore, it may be beneficial to attempt to address the issue of the capacitance seen at each bit line 11, and to omit the sense amplifiers 14 altogether.

SUMMARY

Therefore, an object of this invention is to provide a memory device that does not require a sense amplifier, and that consumes relatively small power.

According to one aspect of this invention, a memory device comprises a memory cell unit, a bit line unit and a buffering unit. The memory cell unit includes a plurality of memory cell groups. Each of the memory cell groups includes at least one memory cell for storing data therein. The bit line unit includes a plurality of first bit lines, each of which is coupled to the at least one memory cell of a respective one of the memory cell groups, and a second bit line for transmitting to-be-read data. The buffering unit includes a plurality of tri-state buffers. Each of the tri-state buffers has an input terminal coupled to a respective one of the first bit lines, and an output terminal coupled to the second bit line.

According to another aspect of this invention, a memory device comprises a memory cell unit, a bit line unit and a buffering unit. The memory cell unit includes a plurality of memory cell groups. Each of the memory cell groups includes at least one memory cell for storing data therein. The bit line unit includes a plurality of first bit lines, each of which is coupled to the at least one memory cell of a respective one of the memory cell groups, and a second bit line for transmitting to-be-read data. The buffering unit includes a plurality of two-state buffers. Each of the two-state buffers has an input terminal coupled to a respective one of the first bit lines, and an output terminal coupled to the second bit line. Each of the two-state buffers is operable between an output enable state and an output disable state based on a voltage at the input terminal, and outputs a predetermined reference voltage at the output terminal when operating in the output enable state.

BRIEF DESCRIPTION OF THE DRAWINGS

Other features and advantages of this invention will become apparent in the following detailed description of the preferred embodiments of this invention with reference to the accompanying drawings, of which.

DETAILED DESCRIPTION

Figure 1:
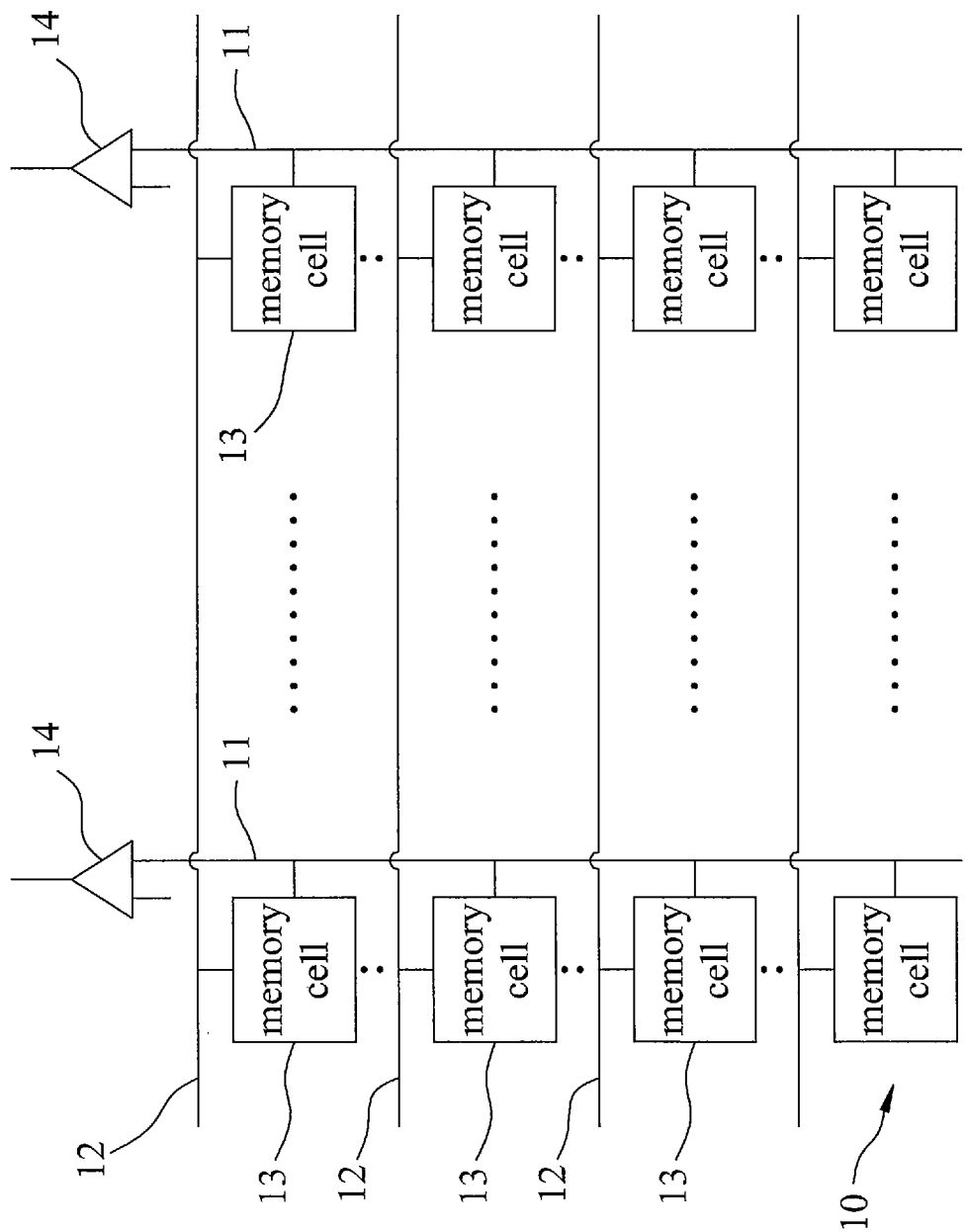
FIG. 1 is a schematic circuit block diagram illustrating a conventional memory device.

Before this invention is described in greater detail with reference to the accompanying preferred embodiments, it should be noted herein that like elements are denoted by the same reference numerals throughout the disclosure.

Figure 2:
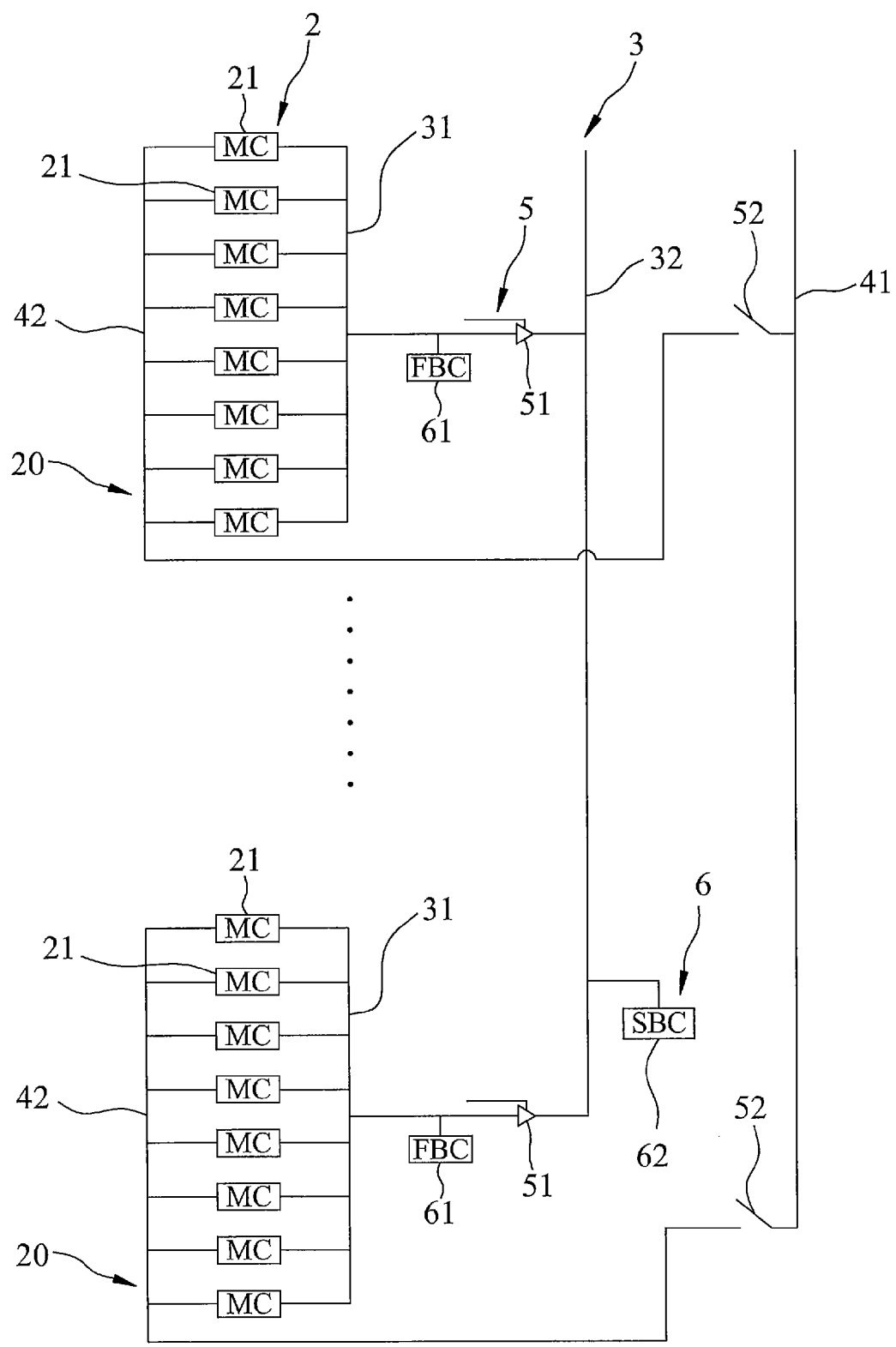
FIG. 2 is a schematic circuit block diagram illustrating the first preferred embodiment of a memory device according to this invention.

Referring to FIG. 2, the first preferred embodiment of a memory device according to this invention includes a memory cell unit 2, a bit line unit 3, a buffering unit 5, a plurality of first switches 52 and a biasing unit 6.

The memory cell unit 2 includes a plurality of memory cell groups 20. Each memory cell group 20 includes at least one memory cell (MC) 21 for storing data therein. In this embodiment, the memory cell unit 2 is in the form of a memory cell line and includes, for example, thirty-two (32) memory cell groups 20, and each memory cell group 20 includes, for example, eight (8) memory cells 21. That is, the total number of the memory cells is, for example, two-hundred-and-fifty-six (256). However, it should be noted that the memory cell groups 20 do not necessarily have to have equal numbers of memory cells 21 in other embodiments of this invention.

The bit line unit 3 includes a plurality of first bit lines 31 each coupled to the memory cells 21 of a respective memory cell group 20, a second bit line 32 for transmitting to-be-read data, a third bit line 41 for transmitting to-be-written data, and a plurality of fourth bit lines 42 each coupled to the memory cells 21 of a respective memory cell group 20.

The buffering unit 5 includes a plurality of tri-state buffers 51. Each tri-state buffer 51 has an input terminal coupled to a respective first bit line 31, and an output terminal coupled to the second bit line 32. Each tri-state buffer 51 is operable between an output enable state and an output disable state, outputs one of two predetermined reference voltages (e.g., a logic high voltage and a logic low voltage) at the output terminal based on a voltage at the input terminal when operating in the output enable state, and does not output any voltage at the output terminal (i.e., exhibiting high impedance at the output terminal) when operating in the output disable state.

Figure 3:
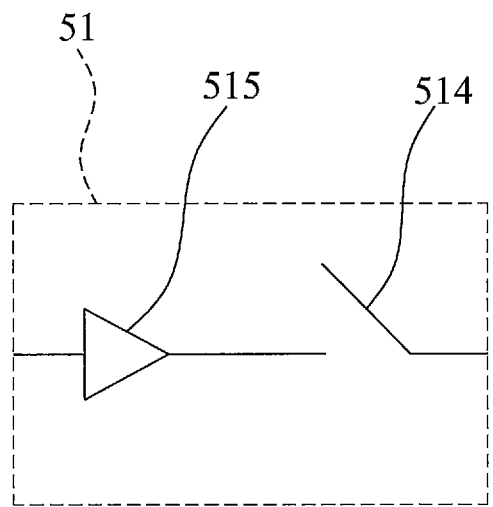
FIG. 3 is a schematic circuit diagram illustrating an alternative of a tri-state of the first preferred embodiment.

In this embodiment, each tri-state buffer 51 is a buffer that is activated and deactivated in the output enable state and the output disable state, respectively. However, as shown in FIG. 3, in other embodiments, each tri-state buffer 51 may be constituted by a buffer 515 and a switch 514 that is coupled to the buffer 515 and that is turned on and off to bring the tri-state buffer 51 in the output enable state and the output disable state, respectively.

Referring back to FIG. 2, it is noted that, for each tri-state buffer 51, the voltage at the output terminal may be in-phase or anti-phase with the voltage at the input terminal. Since each tri-state buffer 51 having the anti-phase configuration may only include, for example, three transistors, the buffering unit 5 has the advantage of occupying a relatively small area when each tri-state buffer 51 has the anti-phase configuration. Moreover, if a voltage at the second bit line 32 is anti-phase with the data stored in each memory cell 21 when the memory cell 21 is read, an inverter (not shown) may be required to be coupled to the second bit line 32 for inverting the voltage at the second bit line 32.

Figure 4:
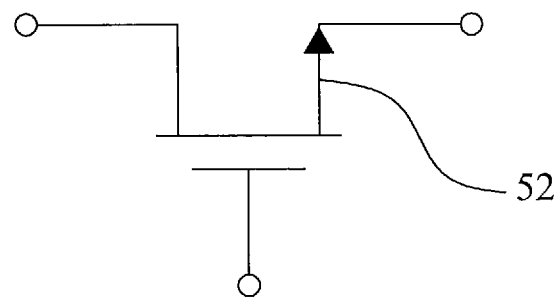
FIG. 4 is a schematic circuit diagram illustrating an example of a first switch of the first preferred embodiment.

Each first switch 52 is coupled between the third bit line 41 and a respective fourth bit line 42. In this embodiment, each first switch 52 is an N-channel metal oxide semiconductor field effect transistor (MOSFET) (see FIG. 4) or alternatively, a P-channel one. However, this invention is not limited to such configuration. For example, each first switch 52 may be a field effect transistor (FET) of other types, e.g., a fin field effect transistor (FinFET).

Figure 5:
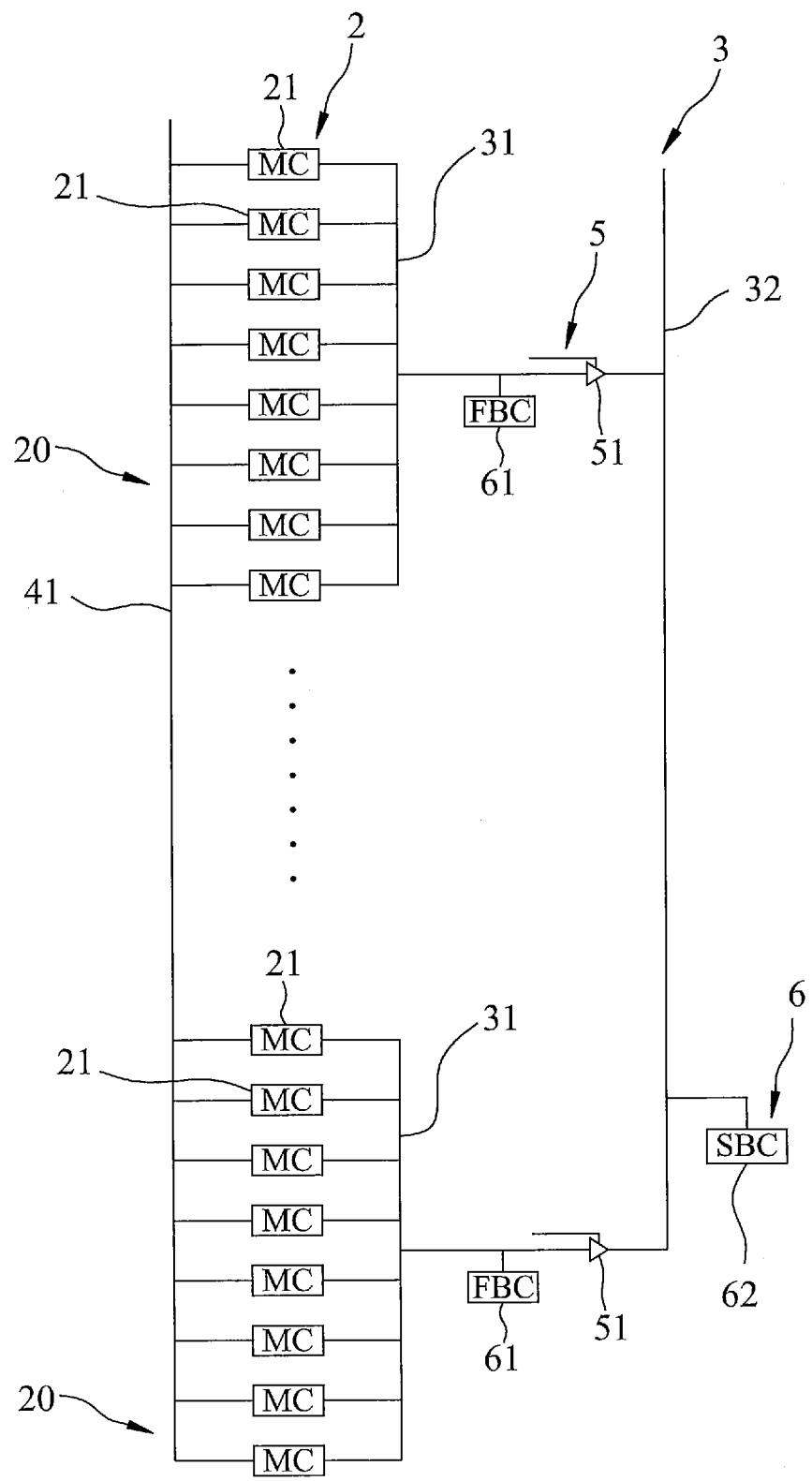
FIGS. 5 to 8 are schematic circuit block diagrams illustrating variations of the first preferred embodiment.

It is noted that the first switches 52 and the fourth bit lines 42 may be omitted in other embodiments. In this case, as shown in FIG. 5, the third bit line 41 is coupled to the memory cells 21 of each memory cell group 20.

Referring back to FIG. 2, the biasing unit 6 includes a plurality of first biasing circuits (FBCs) 61 and a second biasing circuit (SBC) 62. Each first biasing circuit 61 is coupled to a respective first bit line 31 and the input terminal of a respective tri-state buffer 51, and supplies a first predetermined bias voltage thereto when none of the memory cells 21 of a respective memory cell group 20 is read. The second biasing circuit 62 is coupled to the second bit line 32, and supplies a second predetermined bias voltage thereto when all of the tri-state buffers 51 operate in the output disable state.

It is noted that each of the first and second predetermined bias voltages may be the logic high voltage or the logic low voltage, depending on the configuration of the memory cells 21. Moreover, the second biasing circuit 62 may be omitted in other embodiments, in which case the second bit line 32 is adapted to be coupled to an external circuit that can supply the second predetermined bias voltage thereto.

In operation, when one of the memory cells 21 is selected to have data written thereinto, the corresponding first switch 52 is turned on while the other first switches 52 remain turned off, such that the data is written into the selected memory cell 21 through the third bit line 41, the corresponding first switch 52 and the corresponding fourth bit line 42. When one of the memory cells 21 is selected to have data stored therein be read, the corresponding tri-state buffer 51 switches to the output enable state while the other tri-state buffers 51 remain in the output disable state, such that the data stored in the selected memory cell 21 is read through the corresponding first bit line 31, the corresponding tri-state buffer 51 and the second bit line 32.

It is noted that, in this embodiment, each memory cell 21 is read and written at different terminals. However, in other embodiments, each memory cell 21 may be read and written at the same terminal, in which case the fourth bit lines 42 are omitted, and each first switch 52 is coupled to a respective first bit line 31 instead.

Figure 6:
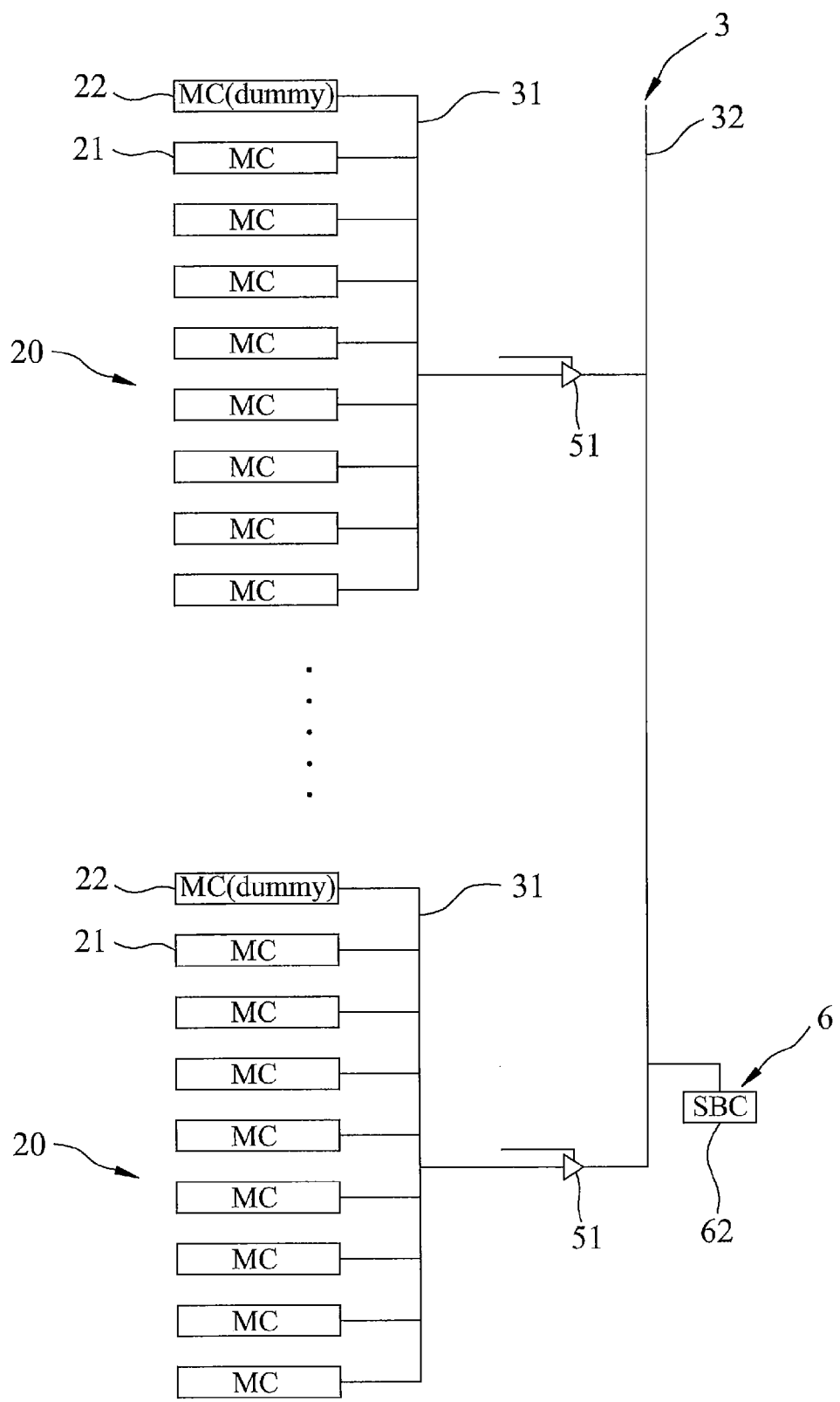

FIG. 6 illustrates a variation of the first preferred embodiment. In this case, the first biasing circuits 61 (see FIG. 2) are omitted, and each memory cell group 20 further includes a dummy cell 22 that is coupled to the respective first bit line 31. For each memory cell group 20, the dummy cell 22 supplies the first predetermined bias voltage to the respective first bit line 31 when none of the memory cells 21 is read. It is noted that the third bit line 41 (see FIG. 2), the fourth bit lines 42 (see FIG. 2) and the first switches 52 (see FIG. 2) are not depicted in FIG. 6 for simplicity of illustration.

Figure 7:
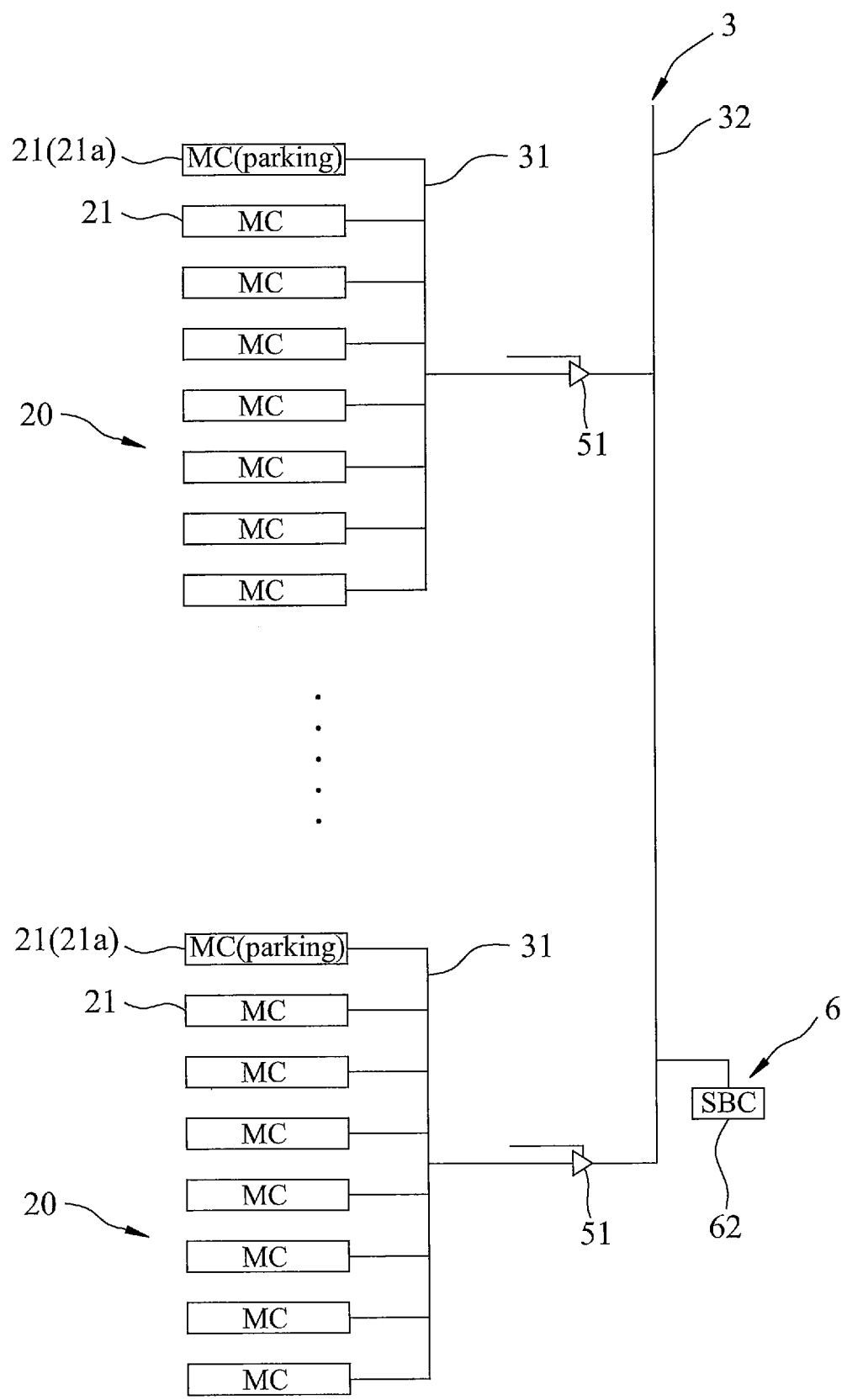

FIG. 7 illustrates another variation of the first preferred embodiment. In this case, the first biasing circuits 61 (see FIG. 2) are also omitted, and for each memory cell group 20, one of the memory cells 21 serves as a parking cell (21a), and outputs the data stored therein to bias the corresponding first bit line 31 when none of the memory cells 21 is read. It is noted that the third bit line 41 (see FIG. 2), the fourth bit lines 42 (see FIG. 2) and the first switches 52 (see FIG. 2) are not depicted in FIG. 7 for simplicity of illustration.

Figure 8:
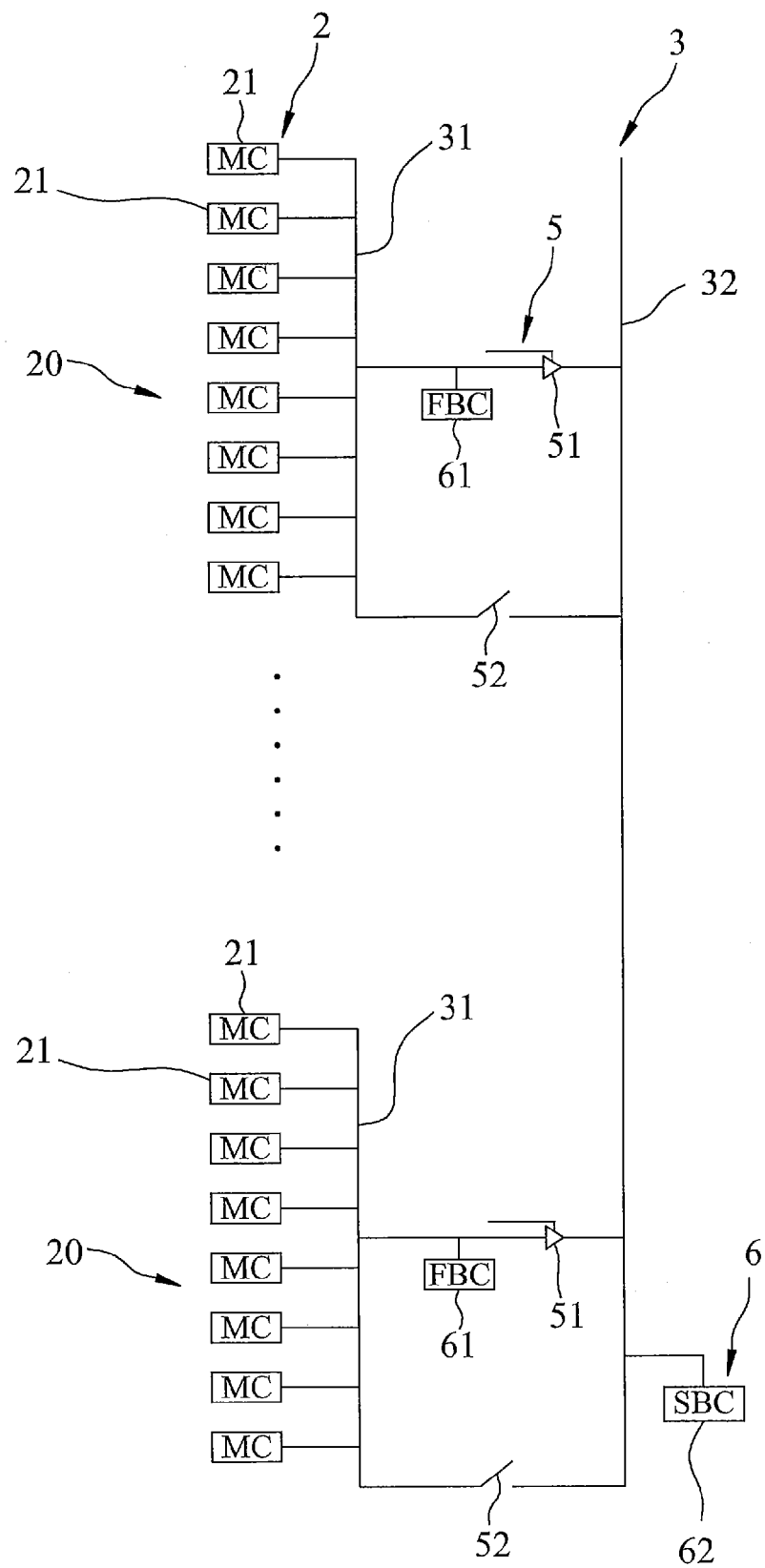

FIG. 8 illustrates yet another variation of the first preferred embodiment. In this case, the third bit line 41 (see FIG. 2) and the fourth bit lines 42 (see FIG. 2) are omitted, and each first switch 52 is coupled between a respective first bit line 31 and the second bit line 32 instead. Moreover, the second bit line 32 further transmits to-be-written data.

In view of the above, the memory device of this embodiment shown in FIG. 2 has the following advantages:

1. Since each first bit line 31 is relatively short and is coupled to a relatively small number (i.e., 8 instead of 256) of memory cells 21, a capacitance seen thereat can be reduced to 1/32 that of the conventional memory device (see FIG. 1). Since it is relatively easy to improve driving capability of each tri-state buffer 51, a resistance seen at the second bit line 32 can be relatively small compared to the conventional memory device (see FIG. 1). For example, it is assumed that the memory device of this embodiment is fabricated using a 28 nm process. In this case, a time constant (e.g., 5RC) of each first bit line 31 may be 0.125 ns with a resistance of 25KΩ and a capacitance of 1 fF, and a time constant (e.g., 5RC) of the second bit line 32 may be 0.15 ns with a resistance of 2KΩ and a capacitance of 15 fF. Due to the relatively small time constants, the memory device of this embodiment can be read at a relatively high frequency compared to the conventional memory device (see FIG. 1).

2. Since each tri-state buffer 51 assists in driving the second data line 32, a sense amplifier is not required, thereby reducing overall power consumption of the memory device of this embodiment.

3. By using a driving circuit (not shown) with a large driving capability to drive the third bit line 41, a time constant of the third bit line 41 can approximate that of each first bit line 31. Therefore, the memory device of this embodiment can be read and written at the same order of frequency.

4. Since each first biasing circuit 61 supplies the first predetermined bias voltage to the input terminal of the respective tri-state buffer 51 when none of the memory cells 21 of the respective memory cell group 20 is read, the input terminal of each tri-state buffer 51 will not be floating, thereby preventing unnecessary power consumption by the memory device of this embodiment.

Moreover, for each of the memory devices shown respectively in FIGS. 6 and 7, since the input terminal of each tri-state buffer 51 is biased by the dummy cell 22 or the parking cell (21a) of the respective memory cell group 20, instead of the respective first biasing circuit 61 (see FIG. 2), the memory device has relatively low design complexity, thereby reducing design time and costs.

Figure 9:
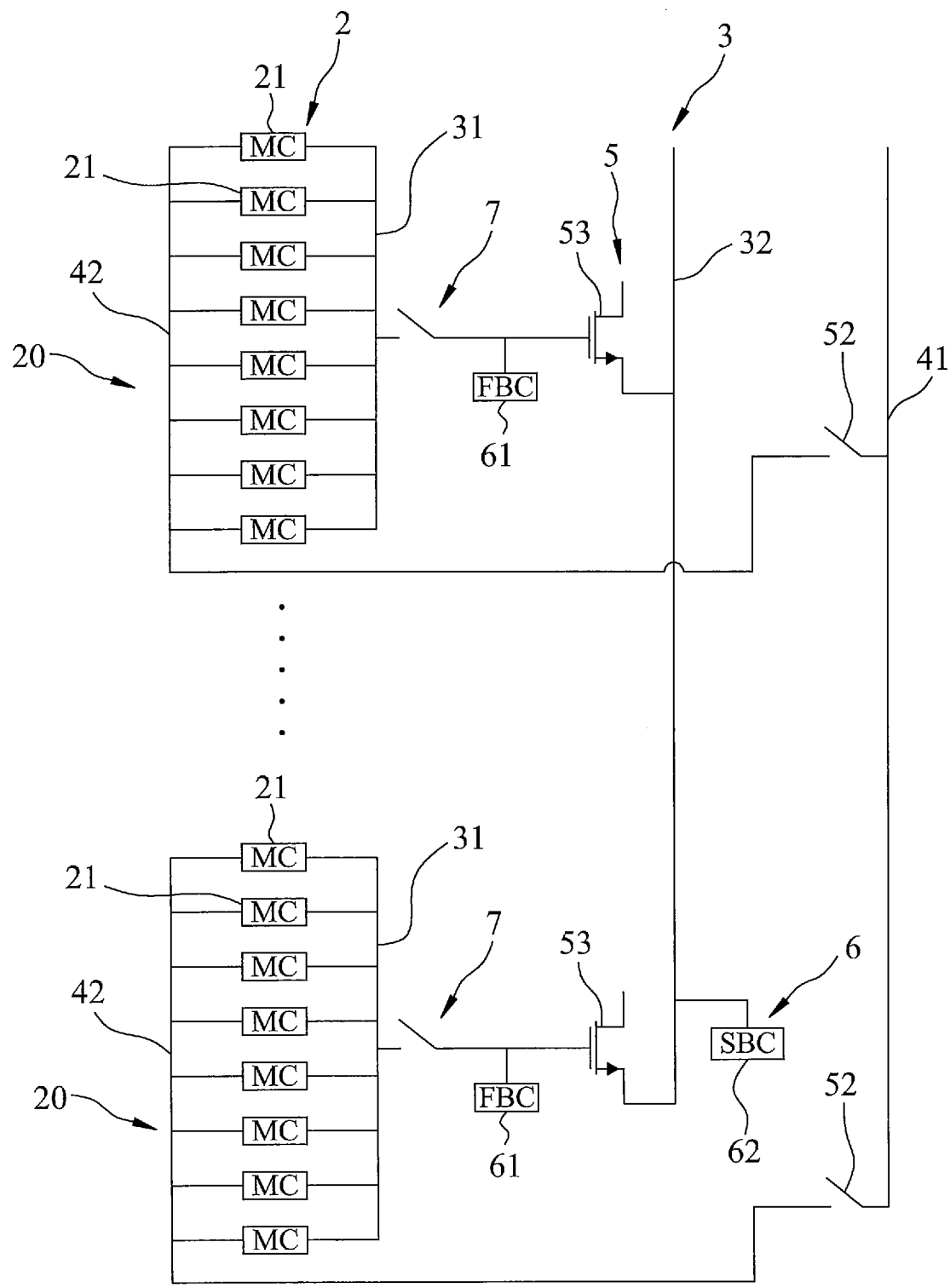
FIG. 9 is a schematic circuit block diagram illustrating the second preferred embodiment of a memory device according to this invention.

Referring to FIG. 9, the second preferred embodiment of a memory device according to this invention is a modification of the first preferred embodiment. Instead of the tri-state buffers 51 (see FIG. 2) of the first preferred embodiment, the buffering unit 5 of the second preferred embodiment includes a plurality of two-state buffers 53. Each two-state buffer 53 has an input terminal coupled to a respective first biasing circuit 61, and an output terminal coupled to the second bit line 32. Moreover, the memory device of the second preferred embodiment further includes a plurality of second switches 7. Each second switch 7 is coupled between the input terminal of a respective two-state buffer 53 and a respective first bit line 31.

Each two-state buffer 53 is operable between an output enable state and an output disable state based on a voltage at the input terminal, outputs a predetermined reference voltage at the output terminal when operating in the output enable state, and does not output any voltage at the output terminal (i.e., exhibiting high impedance at the output terminal) when operating in the output disable state.

The predetermined reference voltage may be the logic high voltage or the logic low voltage depending on design choice. Each two-state buffer 53 may be a transistor (e.g., a FET such as a MOSFET or a FinFET) that has a first terminal (e.g., one of a source terminal and a drain terminal) for receiving the predetermined reference voltage, a second terminal (e.g., the other of the source terminal and the drain terminal) serving as the output terminal, and a control terminal (e.g., a gate terminal) serving as the input terminal, and that is turned on and off to bring the two-state buffer 53 in the output enable state and the output disable state, respectively.

Figure 10:
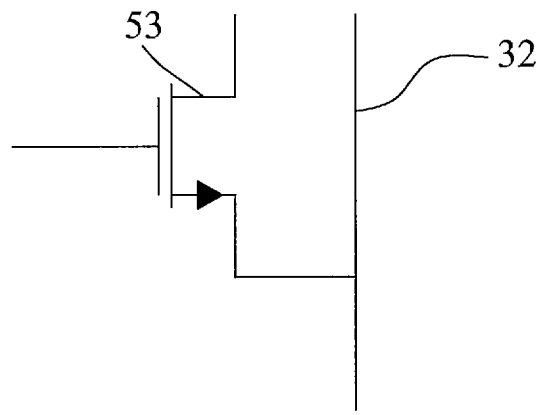
FIG. 10 is a schematic circuit diagram illustrating an example of a two-state buffer of the second preferred embodiment.

In a first example, as shown in FIG. 10, the predetermined reference voltage is the logic high voltage, and each two-state buffer 53 is an N-channel FET, such that each two-state buffer 53 outputs the logic high voltage at the output terminal when the voltage at the input terminal is sufficiently high (i.e., the two-state buffer 53 operating in the output enable state), and exhibits high impedance at the output terminal when the voltage at the input terminal is sufficiently low (i.e., the two-state buffer 53 operating in the output disable state).

Figure 11:
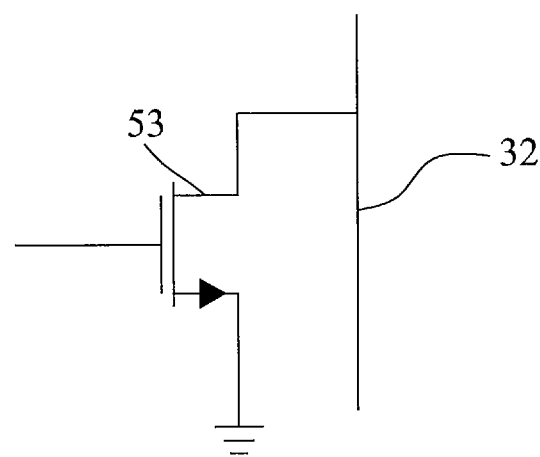
FIGS. 11 to 13 are schematic circuit diagrams illustrating alternatives of the two-state buffer of the second preferred embodiment.

In a second example, as shown in FIG. 11, the predetermined reference voltage is the logic low voltage, and each two-state buffer 53 is an N-channel FET, such that each two-state buffer 53 outputs the logic low voltage at the output terminal when the voltage at the input terminal is sufficiently high (i.e., the two-state buffer 53 operating in the output enable state), and exhibits high impedance at the output terminal when the voltage at the input terminal is sufficiently low (i.e., the two-state buffer 53 operating in the output disable state).

Figure 12:
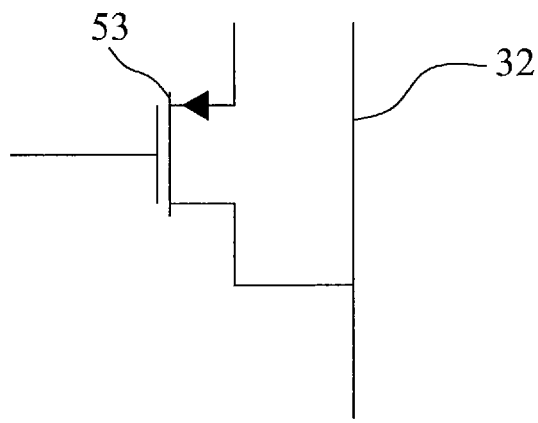

In a third example, as shown in FIG. 12, the predetermined reference voltage is the logic high voltage, and each two-state buffer 53 is a P-channel FET, such that each two-state buffer 53 outputs the logic high voltage at the output terminal when the voltage at the input terminal is sufficiently low (i.e., the two-state buffer 53 operating in the output enable state), and exhibits high impedance at the output terminal when the voltage at the input terminal is sufficiently high (i.e., the two-state buffer 53 operating in the output disable state).

Figure 13:
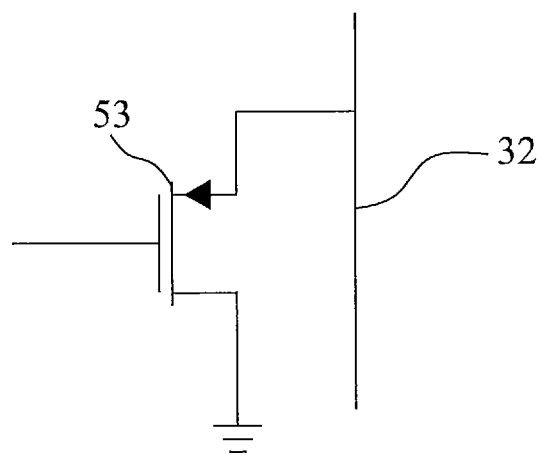

In a fourth example, as shown in FIG. 13, the predetermined reference voltage is the logic low voltage, and each two-state buffer 53 is a P-channel FET, such that each two-state buffer 53 outputs the logic low voltage at the output terminal when the voltage at the input terminal is sufficiently low (i.e., the two-state buffer 53 operating in the output enable state), and exhibits high impedance at the output terminal when the voltage at the input terminal is sufficiently high (i.e., the two-state buffer 53 operating in the output disable state).

Referring back to FIG. 9, each first biasing circuit 61 supplies the first predetermined bias voltage to the input terminal of the respective two-state buffer 53 when none of the memory cells 21 of the respective memory cell group 20 is read. The second biasing circuit 62 supplies the second predetermined bias voltage to the second bit line 32 when all of the two-state buffers 53 operate in the output disable state.

Each of the first and second predetermined bias voltages may be the logic high voltage or the logic low voltage. When each two-state buffer 53 has the configuration shown in FIG. 10, the first predetermined bias voltage may be the logic low voltage, and the second predetermined bias voltage may be the logic low voltage, such that each two-state buffer 53 is biased to the logic low voltage at the input terminal and thus operates in the output disable state if none of the memory cells 21 of the respective memory cell group 20 is read, and such that the second bit line 32 is biased to the logic low voltage if all of the two-state buffers 53 operate in the output disable state. In operation, one of the memory cells 21 is selected to have data stored therein be read. When the data stored in the selected memory cell 21 makes the voltage at the input terminal of the corresponding two-state buffer 53 sufficiently high, the corresponding two-state buffer 53 switches to the output enable state and outputs the logic high voltage to the second bit line 32 while other two-state buffers 53 remain in the output disable state. When the data stored in the selected memory cell 21 makes the voltage at the input terminal of the corresponding two-state buffer 53 sufficiently low, all of the two-state buffers 53 remain in the output disable state, and the second biasing circuit 62 supplies the logic low voltage to the second bit line 32.

Similarly, when each two-state buffer 53 has the configuration shown in FIG. 11, the first predetermined bias voltage may be the logic low voltage, and the second predetermined bias voltage may be the logic high voltage; when each two-state buffer 53 has the configuration shown in FIG. 12, the first predetermined bias voltage may be the logic high voltage, and the second predetermined bias voltage may be the logic low voltage; and when each two-state buffer 53 has the configuration shown in FIG. 13, the first predetermined bias voltage may be the logic high voltage, and the second predetermined bias voltage may be the logic high voltage.

Referring back to FIG. 9, each second switch 7 is turned on when one of the memory cells 21 of the respective memory cell group 20 is read, and is turned off when none of the memory cells 21 of the respective memory cell group 20 is read. In this embodiment, each second switch 7 is an N-channel MOSFET (see FIG. 4) or may alternatively be a P-channel one. However, this invention is not limited to such configuration. For example, each second switch 7 may be a FET of other types, e.g., a FinFET.

It is noted that in other embodiments, the following modifications may be made to the second preferred embodiment:

1. The second switches 7 may be omitted. In this case, the input terminal of each two-state buffer 53 is coupled to the respective first bit line 31.

Figure 14:
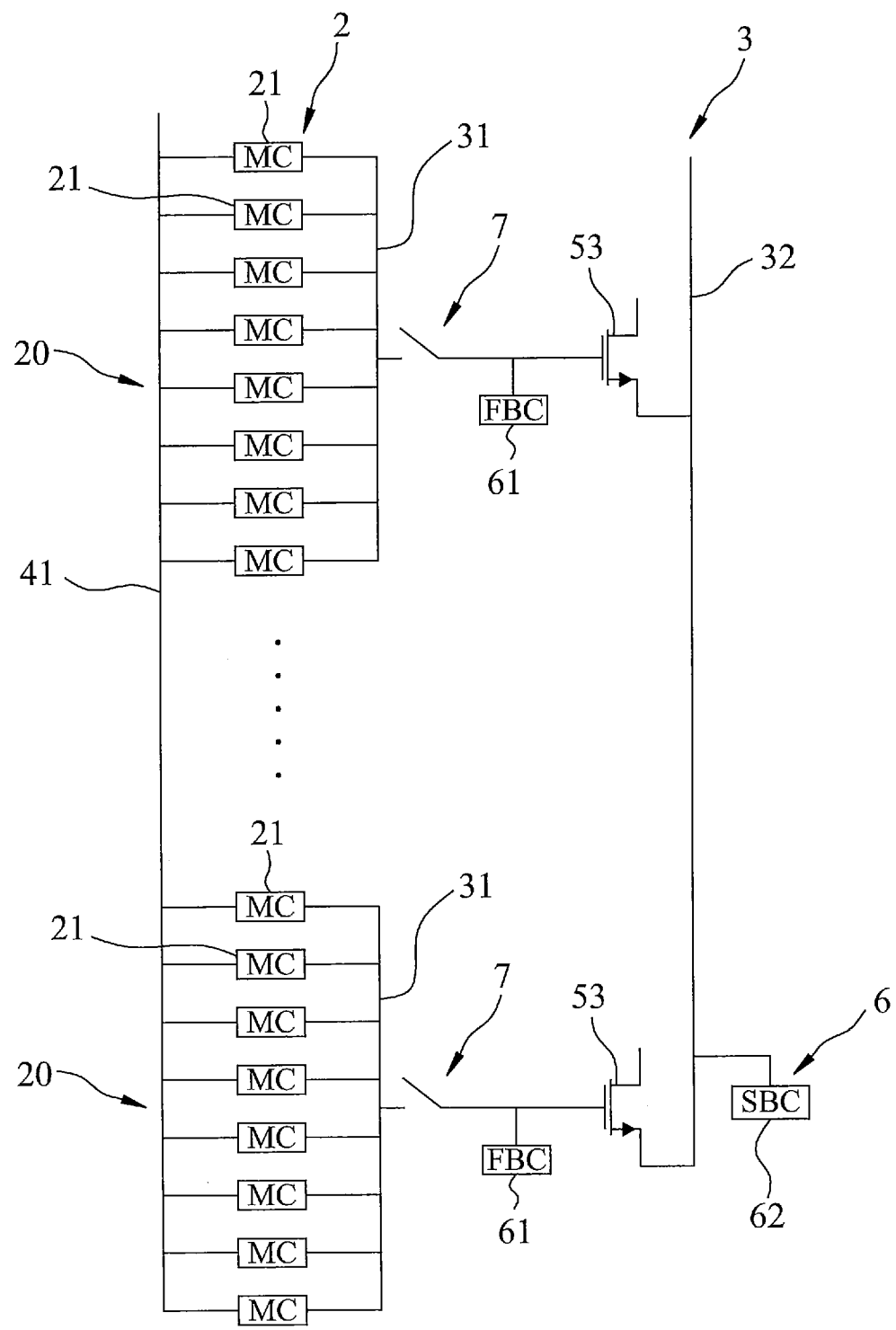
FIGS. 14 to 18 are schematic circuit block diagrams illustrating variations of the second preferred embodiment.

2. The first switches 52 and the fourth bit lines 42 may be omitted. In this case, as shown in FIG. 14, the third bit line 41 is coupled to the memory cells 21 of each memory cell group 20.

Figure 15:
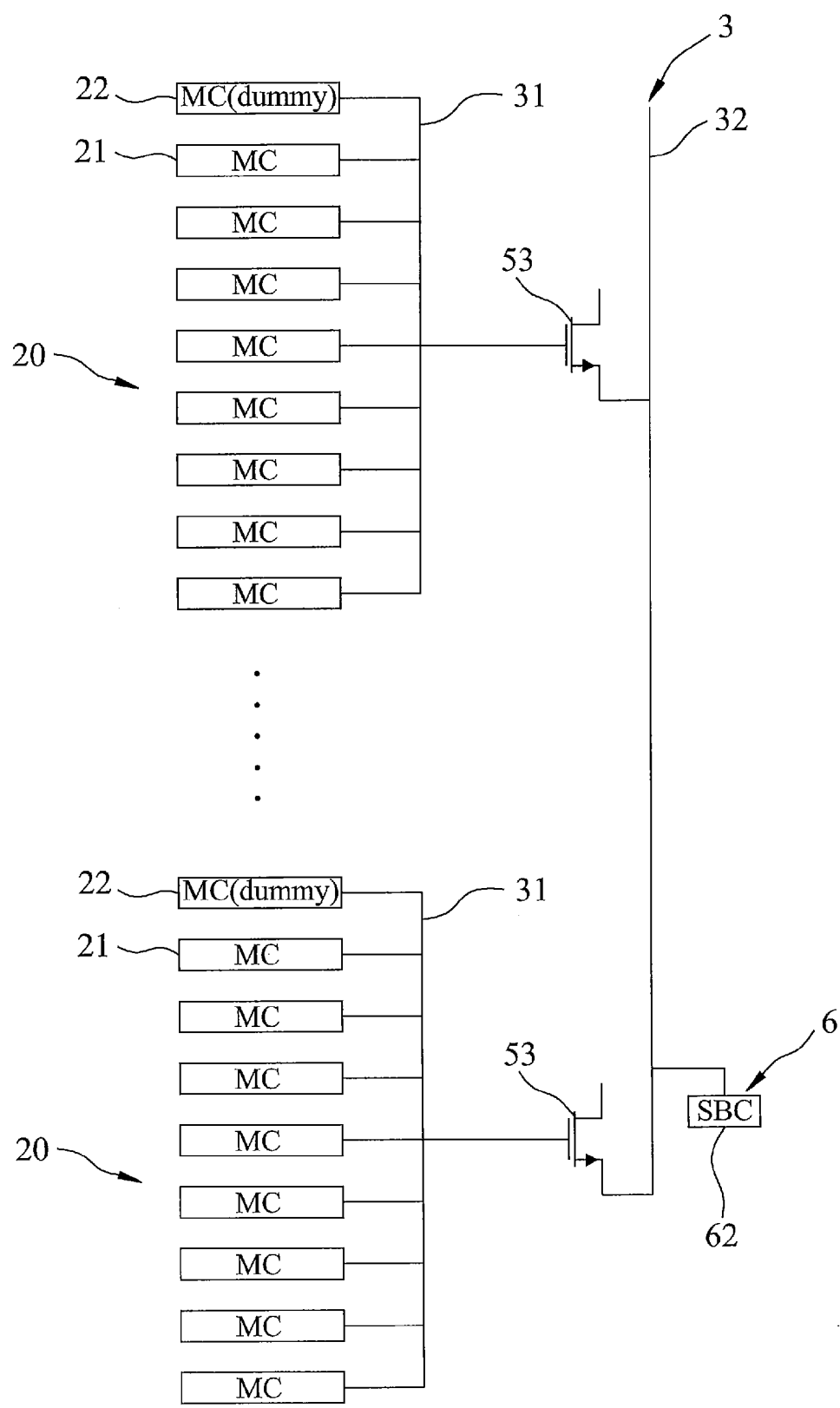

FIG. 15 illustrates a variation of the second preferred embodiment. In this case, the second switches 7 (see FIG. 9) and the first biasing circuits 61 (see FIG. 9) are omitted, the input terminal of each two-state buffer 53 is coupled to the respective first bit line 31, and each memory cell group 20 further includes a dummy cell 22 that is coupled to the respective first bit line 31. For each memory cell group 20, the dummy cell 22 supplies the first predetermined bias voltage to the respective first bit line 31 when none of the memory cells 21 is read. It is noted that the third bit line 41 (see FIG. 9), the fourth bit lines 42 (see FIG. 9) and the first switches 52 (see FIG. 9) are not depicted in FIG. 15 for simplicity of illustration.

Figure 16:
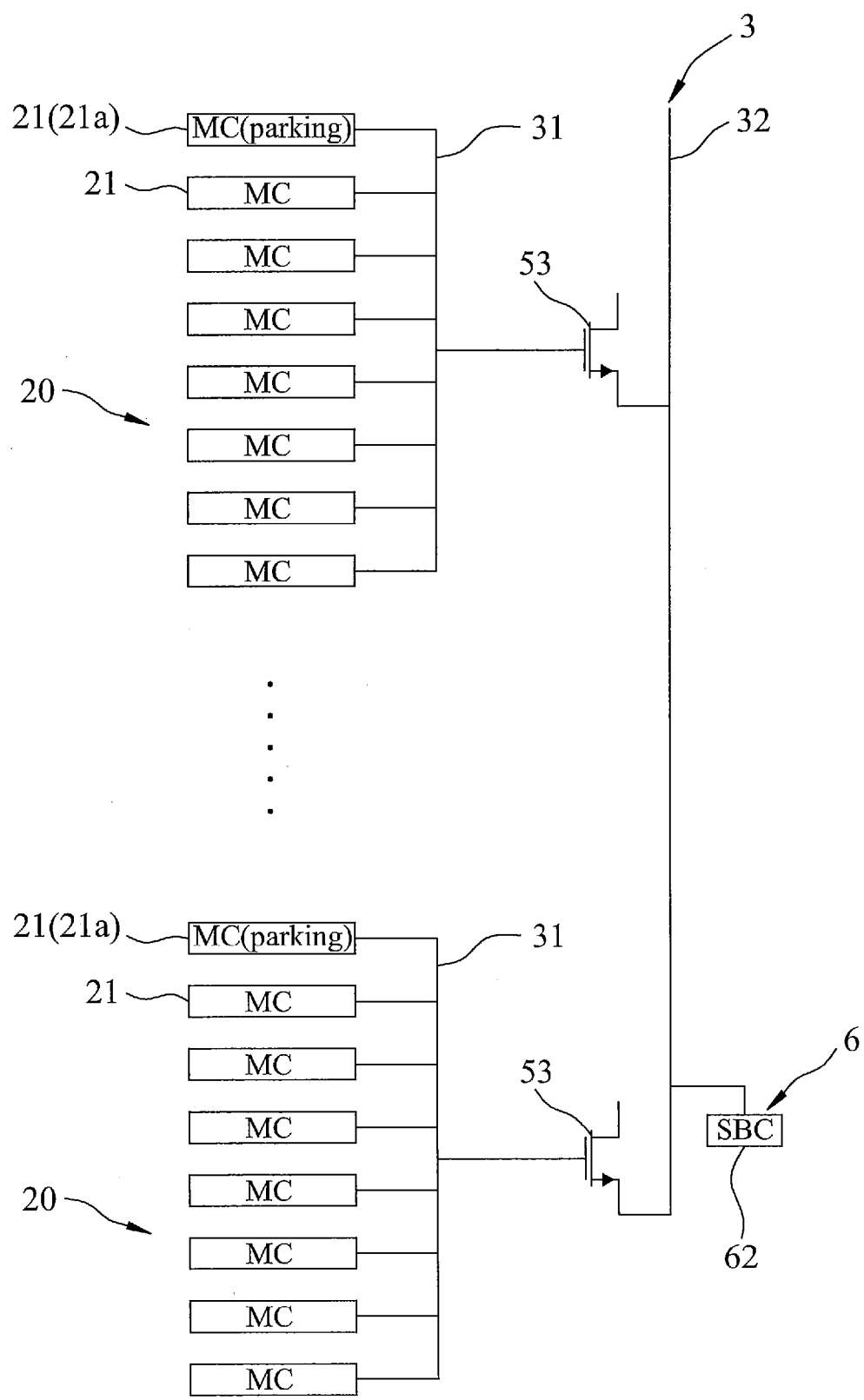

FIG. 16 illustrates another variation of the second preferred embodiment. In this case, the second switches 7 (see FIG. 9) and the first biasing circuits 61 (see FIG. 9) are omitted, and for each memory cell group 20, one of the memory cells 21 serves as a parking cell (21a), and outputs the data stored therein to bias the corresponding first bit line 31 when none of the memory cells 21 is read. It is noted that the third bit line 41 (see FIG. 9), the fourth bit lines 42 (see FIG. 9) and the first switches 52 (see FIG. 9) are not depicted in FIG. 15 for simplicity of illustration.

Figure 17:
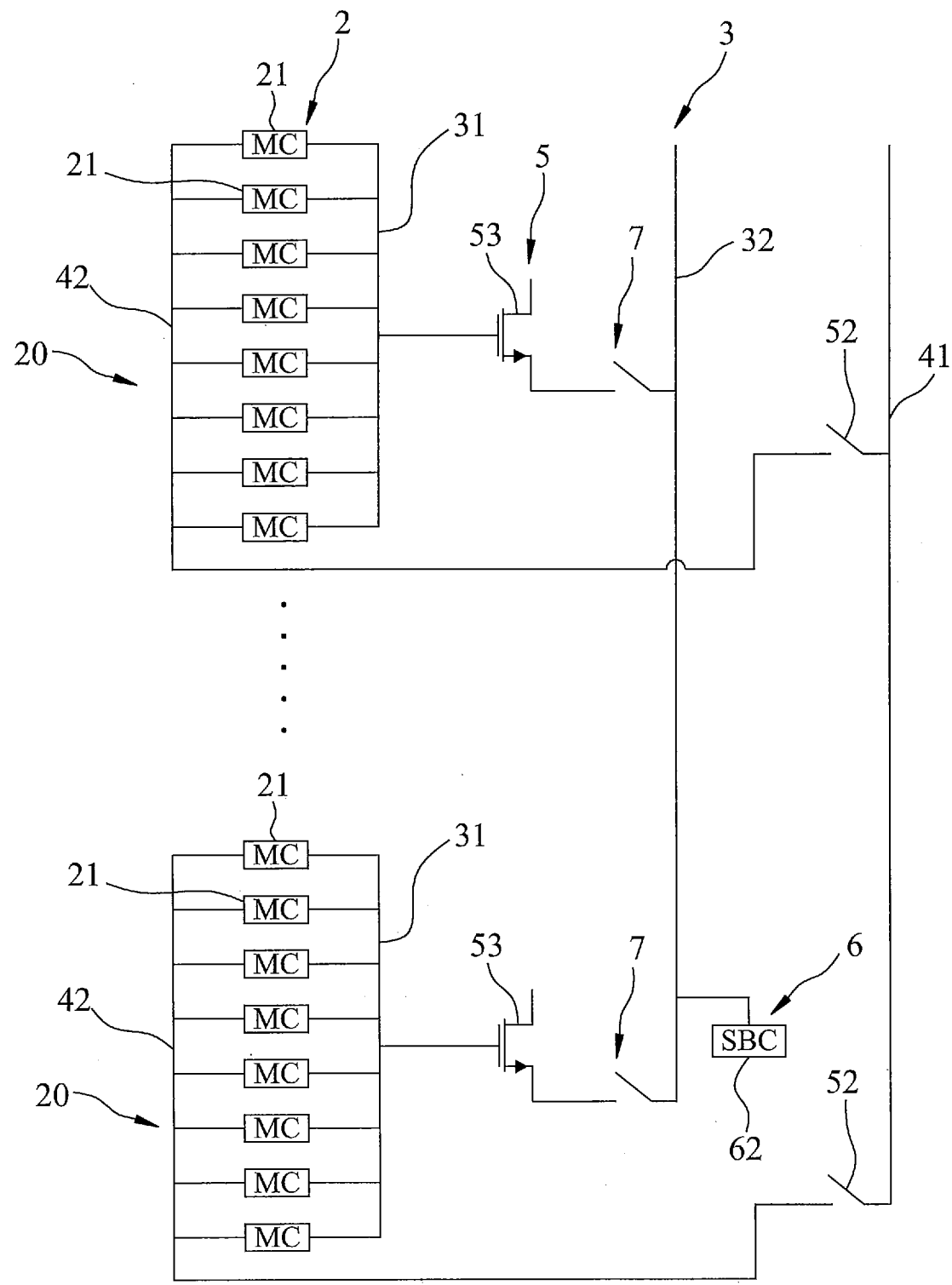

FIG. 17 illustrates yet another variation of the second preferred embodiment. In this case, each second switch 7 is coupled between the output terminal of the respective two-state buffer 53 and the second bit line 32. For each second switch 7, when none of the memory cells 21 of the respective memory cell group 20 is read, the second switch 7 is off, and no current can flow through the respective two-state buffer 53 even if the input terminal of the respective two-state buffer 53 is floating. As a result, the first biasing circuits 61 (see FIG. 9) may be omitted as shown.

Figure 18:
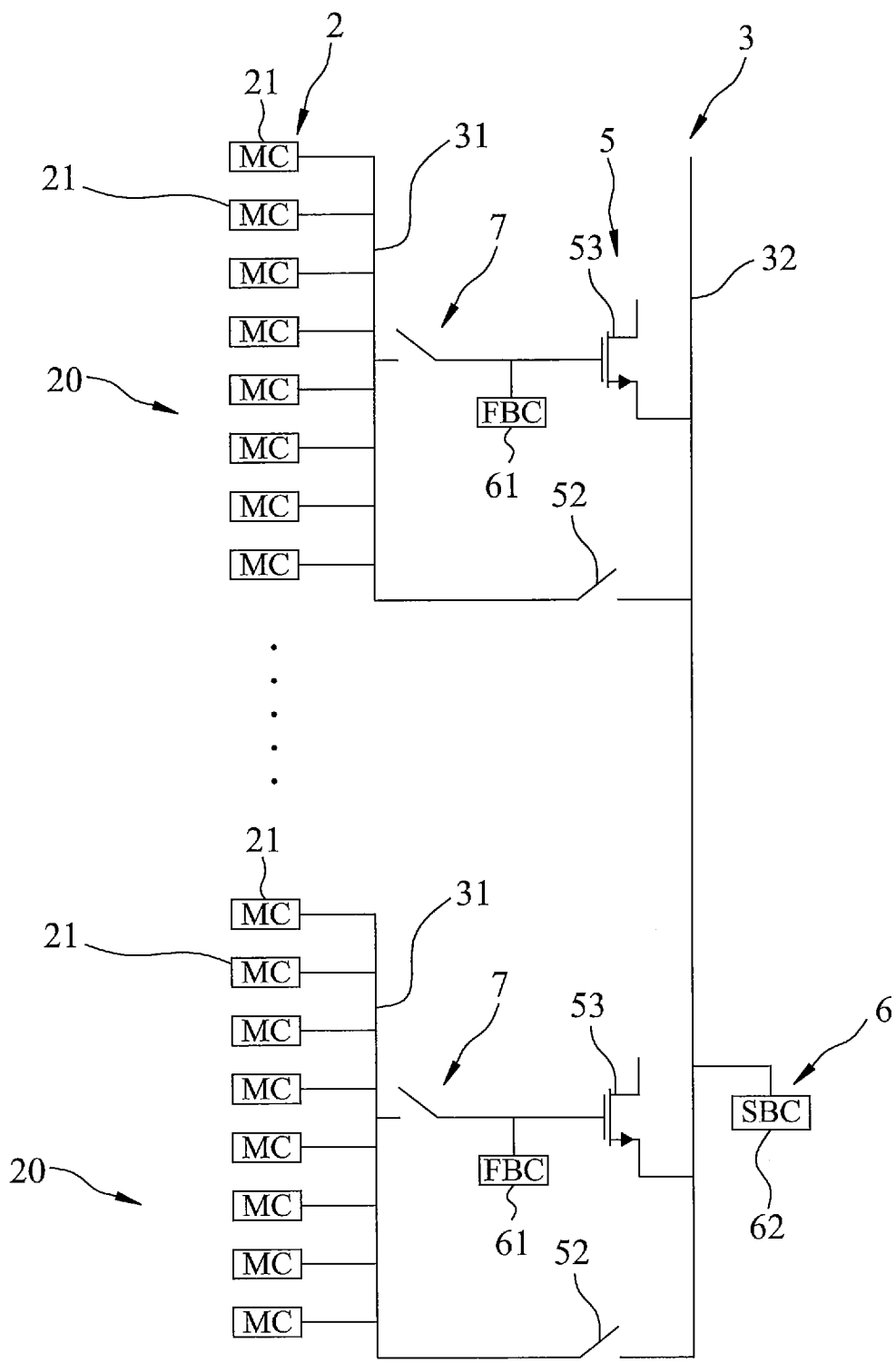

FIG. 18 illustrates still another variation of the second preferred embodiment. In this case, the third bit line 41 (see FIG. 9) and the fourth bit lines 42 (see FIG. 9) are omitted, and each first switch 52 is coupled between a respective first bit line 31 and the second bit line 32 instead. Moreover, the second bit line 32 further transmits to-be-written data.

In view of the above, the memory device of this embodiment further has the following advantages:

1. Since the configuration of the two-state buffer 53 is simpler than that of the tri-state buffer 51 (see FIG. 2), and since the operating state of each two-state buffer 53 is controlled by the voltage at the input terminal, the buffering unit 5 of this embodiment occupies a relatively small area, and has a relatively low design complexity and a relatively flexible layout, as compared to that of the first preferred embodiment (see FIG. 2).

2. Since all of the second switches 7 are turned off and thus the voltage at the input terminal of each two-state buffer 53 remains unchanged when none of the memory cells 21 is read, unnecessary power consumption by the memory device can be prevented even if any of the memory cells 21 outputs the data stored therein at this time.

While this invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A memory device comprising:
   a memory cell unit including a plurality of memory cell groups, each of said memory cell groups including at least one memory cell for storing data therein;
   a bit line unit including a plurality of first bit lines, each of which is coupled to said at least one memory cell of a respective one of said memory cell groups, and a second bit line for transmitting to-be-read data; and
   a buffering unit including a plurality of tri-state buffers, each of said tri-state buffers having an input terminal coupled to a respective one of said first bit lines, and an output terminal coupled to said second bit line;
   wherein said plurality of first bit lines is not directly connected to said second bit line.

2. The memory device of claim 1, further comprising a biasing unit that is coupled to said input terminal of each of said tri-state buffers for supplying a predetermined bias voltage thereto.

3. The memory device of claim 1, further comprising a biasing unit that is coupled to said second bit line for supplying a predetermined bias voltage thereto.

4. The memory device of claim 1, wherein each of said memory cell groups further includes a dummy cell that is coupled to the respective one of said first bit lines for supplying a predetermined bias voltage thereto.

5. The memory device of claim 1, wherein one of said at least one memory cell of each of said memory cell groups outputs the data stored therein to bias a corresponding one of said first bit lines.

6. The memory device of claim 1, wherein said bit line unit further includes a third bit line that is coupled to said at least one memory cell of each of said memory cell groups, and that transmits to-be-written data.

7. The memory device of claim 1, further comprising a plurality of switches;
   wherein said bit line unit further includes a third bit line for transmitting to-be-written data, and a plurality of fourth bit lines, each of which is coupled to said at least one memory cell of a respective one of said memory cell groups; and
   wherein each of said switches is coupled between said third bit line and a respective one of said fourth bit lines.

8. The memory device of claim 1, further comprising a plurality of switches;
   wherein each of said switches is coupled between a respective one of said first bit lines and said second bit line; and
   wherein said second bit line further transmits to-be-written data.

9. The memory device of claim 1, wherein for each of said tri-state buffers, a voltage at said output terminal is anti-phase with a voltage at said input terminal.

10. The memory device of claim 1, wherein said first bit lines of said plurality of first bit lines are electrically isolated from each other.

11. The memory device of claim 1, wherein only one memory cell group is coupled to said second bit line each time during read operation.

12. The memory device of claim 1, wherein said input terminal of each of said tri-state buffers is directly connected to a respective one of said first bit lines.

13. The memory device of claim 1, wherein said output terminals of the plurality of tri-state buffers are directly connected to the same second bit line.

14. The memory device of claim 1, wherein the second bit line is not coupled to an input terminal of a sense amplifier.

* * * * *